United States Patent

Kan et al.

[11] Patent Number: 5,083,696
[45] Date of Patent: Jan. 28, 1992

[54] PIN-HOLDING DEVICE FOR USE IN CONNECTING A PIN

[75] Inventors: Meng Kuang Kan; Bee Suat Ng; Robert Crasta, all of Singapore, Singapore

[73] Assignee: E. I. du Pont de Nemours and Company, Wilmington, Del.

[21] Appl. No.: 711,251

[22] Filed: Jun. 4, 1991

Related U.S. Application Data

[63] Continuation of Ser. No. 528,359, May 25, 1990, abandoned.

[30] Foreign Application Priority Data

Jun. 7, 1989 [JP] Japan .................. 1-66681[U]

[51] Int. Cl.⁵ .............................. B23K 37/04
[52] U.S. Cl. ..................... 228/44.7; 269/43; 269/903; 228/47
[58] Field of Search ........... 228/180.1, 212, 47, 228/57, 44.7; 269/903, 43, 317; 29/764

[56] References Cited

U.S. PATENT DOCUMENTS

| | | | |
|---|---|---|---|
| 1,456,506 | 5/1923 | Leveridge | 269/903 |
| 3,458,184 | 7/1969 | Schlosser | 269/904 |
| 3,552,734 | 1/1971 | Encino | 269/904 |
| 3,559,267 | 2/1971 | Castellani | 29/764 |
| 3,591,922 | 7/1971 | Pardee et al. | 228/180.1 |
| 3,680,193 | 8/1972 | Scaminaci, Jr. et al. | 269/903 |
| 3,728,769 | 4/1973 | Judge et al. | 29/764 |
| 4,641,426 | 2/1987 | Hartman et al. | 228/180.1 |
| 4,864,719 | 9/1989 | Rudy, Jr. et al. | 29/764 |
| 4,884,335 | 12/1989 | McCoy et al. | 228/180.1 |

FOREIGN PATENT DOCUMENTS

| | | | |
|---|---|---|---|
| 118269 | 7/1984 | Japan | 228/180.1 |
| 14990 | 1/1989 | Japan | 228/180.1 |

OTHER PUBLICATIONS

Western Electric, "Mass Solder Loading Fixture Having Masking Pins", Technical Digest, No. 21, Jan. 1971.

Primary Examiner—Samuel M. Heinrich

[57] ABSTRACT

A pin-holding device for use in connecting a pin to a printed circuit board, comprising a substrate for holding a pin to be inserted into the printed circuit board and soldered thereto, the substrate having a pin insertion hole for detachably holding the pin such that at least one end portion of the pin is perpendicularly projected from the substrate, whereby the one end portion of the pin is inserted into the printed circuit board and soldered thereto in a state that the pin is held, thereafter the pin-holding device is detached from the pin.

11 Claims, 2 Drawing Sheets

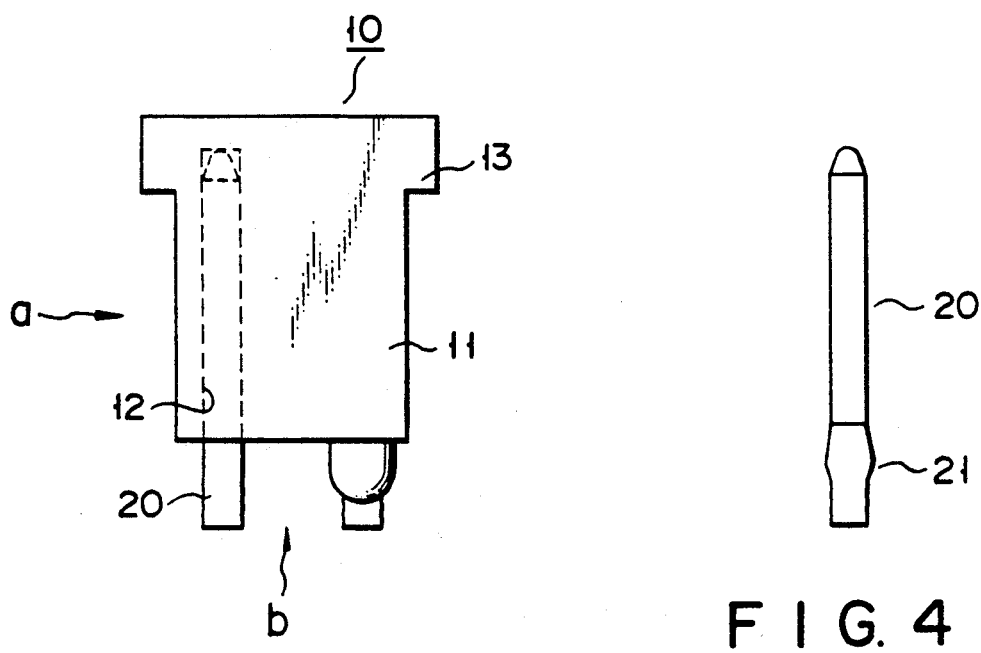
FIG. 1
FIG. 4
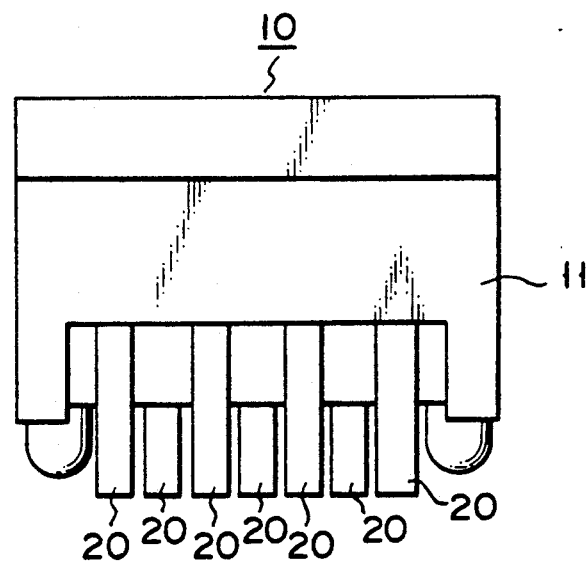
FIG. 2
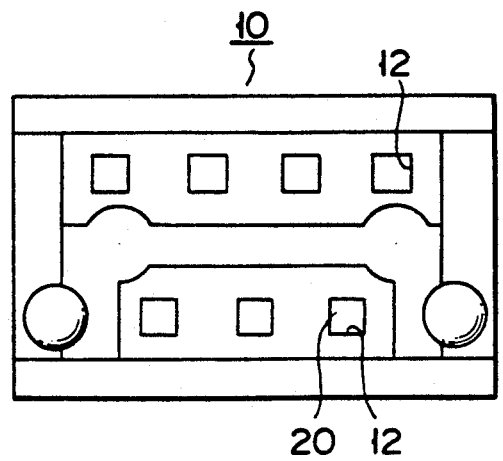
FIG. 3

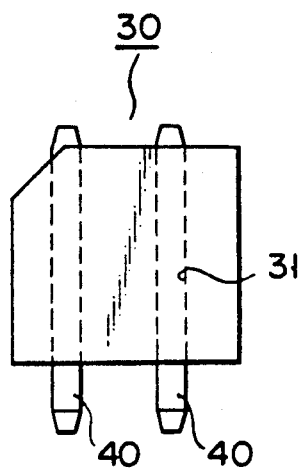
F I G. 5
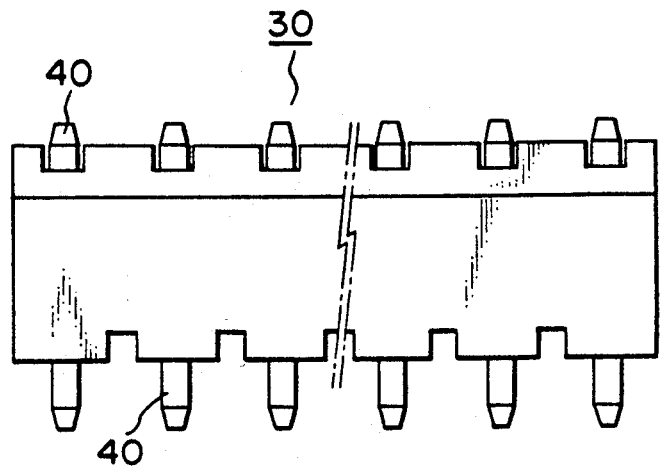
F I G. 6
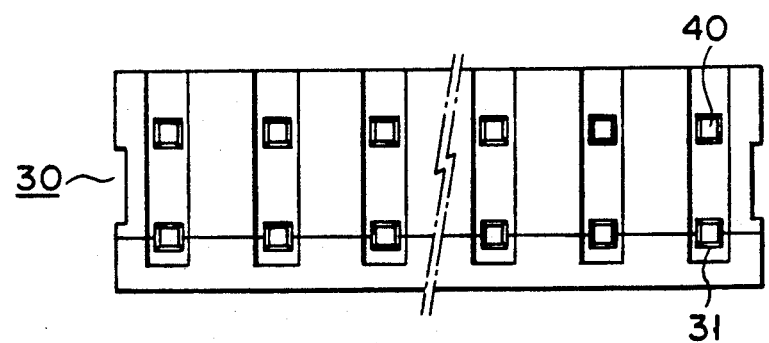
F I G. 7

PIN-HOLDING DEVICE FOR USE IN CONNECTING A PIN

This application is a continuation of application Ser. No. 07/528,359, filed May 25, 1990, now abandoned.

BACKGROUND OF THE INVENTION

1. Field of the Invention

The present invention relates to a pin-holding device for use in connecting a pin to a printed circuit board which holds the pin while the pin is inserted into the printed circuit board and soldered thereto.

2. Description of the Related Art

As a method of electrically connecting a printed circuit board to a female connector, the method using a header is conventionally well-known. In the header, pins are perpendicularly inserted into a plastic plate and fixed thereto. Such a header is used in such a manner that one end of the pin is inserted into the printed circuit board and soldered thereto, so that one end of the pin is attached to the printed circuit board, thereafter a female connector is mated with the other end of the pin. Therefore, in a case when such a header is used, since the plastic plate of the header is provided between the printed circuit board and the female connector, the entire height of the connecting portion between the printed circuit board and the female connector is increased by the thickness of the plastic plate.

Moreover, there is a method in which only pins are directly embedded into the printed circuit board by a machine without using the above-mentioned header. However, in such a machine, since high accuracy is required in providing the space of the pins to be embedded, the embedding direction of the pin, and the depth of the embedding pin, there is disadvantage in that the manufacturing cost of the machine is increased. Moreover, in a case when the printed circuit board is thin, there is a strong possibility that the printed circuit board is split in embedding the pin by the machine. On the other hand, in a case when the pin is manually embedded, the quality thereof is not stabilized, e.g., insufficiency of embedding the pin is generated.

SUMMARY OF THE INVENTION

An object of the present invention is that the height of the connecting portion of the printed circuit board to the other element such as a female connector can be made lower and that the pin can be accurately inserted and soldered into the printed circuit board with an easy operation.

The object can be attained by a pin-holding device for use in connecting a pin to a printed circuit board, comprising a substrate for holding a pin to be inserted into the printed circuit board and soldered thereto, the substrate having a pin insertion hole for detachably holding the pin such that at least one end portion of the pin is perpendicularly projected from the substrate, whereby the one end portion of the pin is inserted into the printed circuit board and soldered thereto in a state that the pin is held, thereafter the pin-holding device is detached from the pin.

BRIEF DESCRIPTION OF THE DRAWINGS

FIGS. 1, 2, and 3 are the side view, front view, and the plan view of the pin-holding device of the first embodiment of the present invention respectively;

FIG. 4 is a view showing the pin used in the above pin-holding device; and

FIGS. 5, 6, and 7 are the side view, front view, and the plan view of the pin-holding device of the second embodiment of the present invention respectively.

DETAILED DESCRIPTION OF THE INVENTION

According to the present pin-holding device, the pin is soldered to the printed circuit board, thereafter the device is detached from the pin. Therefore, as compared with the use of the conventional header, the height of the connecting portion of the printed circuit board to a female connector can be made lower. Also, since the pin is inserted into the printed circuit board and soldered as being held perpendicularly to the present pin-holding present device, the pin can be surely and perpendicularly soldered without being inclined to the printed circuit board.

The substrate of the present pin-holding device is formed of plastic, and has an insertion hole through which the pin is inserted and held. It is important to form the hole such that the pin is fixed to the hole without being detached therefrom while the pin is inserted into the printed circuit board and soldered thereto, and that the pin is easily detached from the hole after the pin is soldered to the printed circuit board.

For the substrate of the present device, a suitable thickness is required so that the pin is surely held without deforming the substrate by the heat of melted solder when the pin is soldered. Moreover, if a plurality of holes are arranged in accordance with the circuit of the printed circuit board so that the plurality of pins are held at the same time, the plurality of pins can be accurately inserted into the printed circuit board at one time. As a shape of the cross section of the pin to be held in the present device, a circular cross section, a rectangular cross section, and the other shapes can be used.

According to the present pin-holding device, the height of the connecting portion of the printed circuit board to the other elements can be made lower. In addition to this matter, the depth of the hole is controlled and the length of the pin protecting from the hole is set to be a predetermined length, thereby the depth of the embedding the pin into the printed circuit board can be easily controlled. Also, by the use of the present device, danger of which the printed circuit board is split is small even if the printed circuit board is extremely thin, and there is no possibility that the pin will be inclined in soldering.

DETAILED DESCRIPTION OF THE PREFERRED EMBODIMENTS

Embodiments of the present invention will be described with reference to the drawings as follows.

FIG. 1 is a side view of a pin-holding device 10 of present invention and shows the state in which a pin 20 is held by a hole 12 of a substrate 11. FIGS. 2 and 3 are views of the pin-holding device 10 seen in the directions of arrows a and b. In the substrate 11, holes 12 are arranged in a lattice manner, and the pin 20 can be inserted into each hole 12.

To hold the pin in the hole by a suitable holding force, the inner diameter of the hole is set to be slightly smaller than the outer diameter of the pin, so that the pin can be held by frictional force between the hole and the pin or elastic power of a plastic material constituting the substrate in which the hole is formed, when the pin is pressed into the hole. Also, it is possible to provide a suitable projecting portion on the surface of the pin to be engaged to the hole. Moreover, an elastic member, which can hold the pin by a suitable supporting force, may be arranged in the interior of the hole, so that the pin can be held by the elastic member.

In a case of the embodiment shown in FIG. 1, the pin 20 has a small projecting portion 21 at the position corresponding to the portion close to the entrance of the hole 12 of the substrate 11, as shown in FIG. 4. Then, the pin 20 can be engaged to the hole 12 by the projecting portion 21.

The device 10 shown in FIG. 1 has a step portion 13 whose cross section is T-shaped. After the pin 20 is soldered to the printed circuit board, the step portion 13 is used as a knob in pulling the device 10 by a hand.

FIGS. 5, 6, and 7 show a pin-holding device 30 of the second embodiment of the present invention. In the device 30, a hole 31 is passed through the device 30, and both ends of pin 40 are projected from the device 30. When the length of the pin is long, the thickness of the pin-holding device is made thinner than the length of the pin, thereby materials such as plastic, etc., which constitute the pin-holding device, can be reduced.

As mentioned above, according to the present pin-holding device for use in connecting a pin, the height of the connecting portion of the printed circuit board to the other elements can be made lower than the case using the conventional header, and the inserting the pin into the printed circuit board and soldering the pin thereto can be easily and surely performed.

What is claimed is:

1. A pin-holding apparatus, comprising:
    a plurality of pins, each of the pins having a longitudinal axis; and
    a substrate having a first side and a plurality of holes arranged in parallel rows and columns perpendicular to and extending into the first side, one of the pins in each of the holes such that the pins extend out of the holes a predetermined distance through the first side, each of the holes for detachably holding one of the pins only by elastic and/or friction forces within the hole,
    whereby the substrate is adapted to be used in inserting the pins in a printed circuit board, holding the pins with respect to the board while the pins are soldered to the board and then detaching from the pins by pulling the substrate by hand allowing a female connector to receive the pins immediately adjacent the board.

2. The pin-holding apparatus of claim 1, wherein each of the holes are slightly smaller perpendicular to the longitudinal axes of the pins than the pin in the hole such that the pins are held in the holes only by elastic and/or friction forces directly between the pins and the substrate.

3. The pin-holding apparatus of claim 1, further comprising:
    an elastic member positioned in each of the holes, each one of the elastic members for holding one of the pins.

4. The pin-holding apparatus of claim 1, wherein the pins include projecting portions for engaging walls of the holes.

5. The pin-holding apparatus of claim 1, wherein:
    the substrate has a second side and the holes extend entirely through the substrate between the first side and the second side; and
    the pins extend out of the holes a predetermined distance through the second side.

6. A method of connecting a plurality of pins to a printed circuit board, comprising:
    detachably holding the plurality of pins in a plurality of holes arranged in parallel rows and columns perpendicular to and extending into a first side in a substrate, the pins being detachably held only by elastic and/or friction forces within the holes;
    inserting the pins in a printed circuit board;
    holding the pins with the substrate with respect to the board while the pins are soldered to the board; and
    detaching the substrate from the pins by pulling the substrate.

7. The method of claim 6, wherein the detachably holding step is performed by holding the pins in the holes only by elastic and/or friction forces directly between the pins and the substrate.

8. The method of claim 6, wherein the detachably holding step is performed by holding the pins by elastic members positioned in the holes.

9. The method of claim 6, wherein the substrate is detached from the pins by pulling on a T-shaped step portion of the substrate by hand.

10. The method of claim 6, further comprising:
    forcing a female connector to receive the pins such that the female connector is immediately adjacent the board.

11. A pin-holding device for use in connecting a plurality of pins to a printed circuit board, each of the pins having a longitudinal axis, the device comprising:
    a substrate having a first side and a plurality of holes arranged in parallel rows and columns perpendicular to and extending into the first side, and
    an elastic member positioned in each of the holes, each one of the elastic members for detachably holding one of the pins only by elastic and/or friction forces within the hole,
    whereby the substrate is adapted to be used in inserting the pins in a printed circuit board, holding the pins with respect to the board while the pins are soldered to the board and then detaching from the pins by pulling the substrate by hand allowing a female connector to receive the pins immediately adjacent the board.

* * * * *